United States Patent [19]
Tam

[11] Patent Number: 5,748,015
[45] Date of Patent: May 5, 1998

[54] LOW VOLTAGE SINGLE ENDED DYNAMIC SENSE AMPLIFIER

[75] Inventor: Kenway W. Tam, Cupertino, Calif.

[73] Assignee: Sun Microsystems, Inc., Palo Alto, Calif.

[21] Appl. No.: 675,247

[22] Filed: Jul. 1, 1996

[51] Int. Cl.$^6$ .................................................. G01R 19/00
[52] U.S. Cl. ........................................... 327/51; 327/309
[58] Field of Search ................................. 327/51–57, 77, 327/374, 376, 377, 427, 309, 310; 365/189.21, 203

[56] References Cited

U.S. PATENT DOCUMENTS

| | | | |
|---|---|---|---|
| 4,811,300 | 3/1989 | Lanfranca | 365/203 |
| 5,013,943 | 5/1991 | Hirose | 327/51 |
| 5,295,104 | 3/1994 | McClure | 365/210 |
| 5,438,283 | 8/1995 | Lev | 326/108 |
| 5,477,484 | 12/1995 | Nakashima | 365/203 |
| 5,495,191 | 2/1996 | Lev et al. | 327/51 |
| 5,619,149 | 4/1997 | Lev et al. | 327/51 |

OTHER PUBLICATIONS

A High–Speed Clamped Bit–Line Current–Mode Sense Amplifier, by Travis N. Blalock et al., IEEE Journal of Solid State Circuits, vol. 26., No. 4, Apr. 1991, pp. 542–548.

A 7–ns 140mW 1–Mb CMOS SRAM with Current Sense Amplifier, by Katsuro Sasaki et al., IEEE Journal of Solid State Circuits, vol. 27, No. 11, Nov. 1992, pp. 1511–1518.

Current–Mode Techniques for High–Speed VLSI Circuits with Application to Current Sense Amplifier for CMOS SRAM's, by Evert Seevinck et al., IEEE Journal of Solid State Circuits, vol. 26, No. 4, Apr. 1991, pp. 525–536.

*Primary Examiner*—Toan Tran
*Attorney, Agent, or Firm*—Philip J. McKay

[57] ABSTRACT

An improved single ended dynamic sense amplifier circuit for sensing the state of a bitline in a read only memory is disclosed which includes a threshold control circuit coupled to a noise margin circuit and a discharge circuit. A sense node couples the discharge circuit to a precharge circuit and an output circuit. The threshold control circuit maintains a bias on the discharge circuit such that during the precharge phase of operation, the discharge circuit is shut off and then conditionally turned off and on. The inclusion of the threshold control circuit in the disclosed single ended dynamic sense amplifier circuit provides for fully functional operation at supply voltages of close to 1.0 volt.

19 Claims, 5 Drawing Sheets ed signal, and an output circuit coupled to the first and second discharge nodes for providing an output signal having a logic state which corresponds to the state of the bitline.

LOW VOLTAGE SINGLE ENDED DYNAMIC SENSE AMPLIFIER

RELATED APPLICATIONS

The present application is related to U.S. Pat. No. 5,495,191 entitled "SINGLE ENDED DYNAMIC SENSE AMPLIFIER" issued to Lev et al. on Feb. 27, 1996 and U.S. Pat. No. 5,438,283 entitled "FAST STATIC CASCODE LOGIC GATE" issued to Lev et al. on Aug. 1, 1995, both of which are assigned to the assignee of the present invention and both of which are incorporated herein, in their entirety, by reference.

BACKGROUND OF THE INVENTION

1. Field of the Invention

The method and apparatus of the present invention relates generally to the sensing of data in a memory, and more particularly to the sensing of data levels in read only memories using a low voltage single ended dynamic sense amplifier.

2. Related Art

Read only memories (ROMs), whether implemented as stand alone memory circuits or used in a processor register file, typically include a number of memory locations arranged in a matrix of rows and columns. The contents of a memory location are read by applying an input voltage to a selected wordline, or row, and sensing whether the voltage of the bitline, or column, changes. The bitline acts as a capacitor, and is typically precharged to a predetermined voltage prior to reading the memory location. If the memory location includes a field effect transistor (FET) having its source coupled to ground, its drain coupled to the bitline, and its gate coupled to the selected wordline, the input voltage causes the FET to switch on, coupling the bitline to ground. Coupling the bitline to ground causes the bitline to discharge, and the voltage of the bitline drops towards ground, indicating a first logic state. If the memory location does not contain a FET, applying the input voltage has no effect on the bitline, and the bitline remains at the precharged voltage, indicating a second logic state.

Typical prior art ROMs use a sense amplifier to sense the state of the selected bitline. One type of sense amplifier is a single ended sense amplifier that has the bitline as its input. The presence of a transistor at the selected memory location is detected by the negative going voltage of the bitline, which is caused by the bitline discharging towards ground when the transistor is switched on.

One concern in sense amplifier design is the speed of the sense amplifier. The speed of the sense amplifier is determined by the sensitivity of the sense amplifier to the discharging of the bitline. A very sensitive sense amplifier has its trip-point voltage, Vtp, very close to the precharge voltage, which is typically Vcc, such that a small drop in the voltage level of the bitline causes the sense amplifier to detect a programmed memory location. For a very low sensitivity sense amplifier, Vtp may be ground. This type of sense amplifier is relatively immune to the effects of noise, however, it typically takes more time to discharge the bitline from Vcc to ground than it takes to discharge the bitline from Vcc to Vcc minus a millivolt. It also takes longer to precharge the bitline to Vcc when the bitline is discharged to a lower voltage. Thus, the more sensitive the sense amplifier, the less time it will take to discharge the bitline and to precharge the bitline provided that the bitline is not fully discharged after Vtp is reached.

Another consideration in sense amplifier design is power consumption. The act of charging and discharging the bitline results in power consumption. The greater the swing between precharged and discharged voltage levels, the greater the power consumption. This consideration is essential in portable computing devices. Therefore, the level to which the bitline must be precharged is an important consideration in portable computer designs.

One prior art sense amplifier design provides a cascode device coupled between the bitline and the input of the output stage of the single-ended sense amplifier. An example of such a circuit may be found in *Design and Analysis of VLSI Circuits* by Lance A. Glasser and Daniel W. Dobberpuhl, at pages 273–274. A problem of this prior art sense amplifier is that noise on the bitline can cause the cascode transistor to inadvertently switch on, resulting in the reading of invalid data. This is due to the fact that the gate-source voltage of the device is just at the edge of the threshold voltage. Therefore, a noise margin must be provided to account for noise that can be injected on the bitline. Such noise can be, for example, a result of capacitive coupling of adjacent bitlines in the matrix. Providing a sufficient noise margin increases the reliability of data.

A more recent sense amplifier design is the "single ended dynamic sense amplifier". A detailed example of this type of sense amplifier is set forth in U.S. Pat. No. 5,495,191 entitled "SINGLE ENDED DYNAMIC SENSE AMPLIFIER" issued to Lev et al. on Feb. 27, 1996, assigned to the assignee of the present invention, and incorporated herein, in its entirety, by reference.

FIG. 1 is a block diagram of a prior art single ended dynamic sense amplifier 100 which includes an output circuit 125, having an input 126 coupled to input or "sense" node 120 and an output 130 for indicating the state of bitline 110 in response to a bitline voltage level (VB). Prior art single ended dynamic sense amplifier 100 also includes a discharge circuit 115. Sense node 120 couples discharge circuit 115 to a precharge circuit 106 and to input 126 of output circuit 125. Precharge circuit 106 precharges sense node 120 between read cycles to a sense voltage (VS) which is typically approximately Vcc.

Output circuit 125 senses the voltage level at sense node 120 and outputs a resulting output voltage (Vout) at output node 130. The output voltage (Vout) typically corresponds to either a logic high or a logic low level, depending on the state of bitline 110. Typically, an erased memory location is indicated by a logic high and a programmed memory location is indicated by a logic low. If output circuit 125 senses that VS is above a trip point voltage (VTP) during a read cycle, Vout is set to a logic low voltage level. If VS falls below VTP, output circuit 125 sets Vout to a logic high voltage level.

Discharge circuit 115 is for coupling and decoupling sense node 120 and the bitline 110 in response to the bitline voltage VB. The capacitance of sense node 120 (Csense) is typically much less than the capacitance of bitline 110 (Cbitline) such that, when discharge circuit 115 couples sense node 120 to bitline 110, VS drops rapidly to the voltage level of bitline 110, which is VB. Discharge circuit 115 typically includes a field effect transistor (not shown in FIG. 1) coupled as a cascode device for coupling and decoupling input 126 to bitline 110. One example of a cascode device is set forth in U.S. Pat. No. 5,438,283 entitled "FAST STATIC CASCODE LOGIC GATE" issued to Lev et al. on Aug. 1, 1995, assigned to the assignee of the present invention, and incorporated herein, in its entirety, by reference.

Prior art single ended dynamic sense amplifier 100 also includes noise margin circuit 105 for providing a noise margin. Between read cycles, noise margin circuit 105 precharges bitline 110. Bitline 110 is preferably charged such that VB is just large enough to provide a desired noise margin voltage. Typically, only sense node 120 is charged to Vcc. This charging may be done quickly due to the relatively small capacitance Csense. However, bitline 110 is typically charged only enough to provide a predetermined noise margin (Vnoise) such that any drop in the bitline voltage VB that does not exceed Vnoise will not result in discharge circuit 115 coupling sense node 120 to bitline 110.

FIG. 2 illustrates prior art single ended dynamic sense amplifier 100 of FIG. 1 with noise margin circuit 105 and discharge circuit 115 shown in more detail. As shown in FIG. 2, discharge circuit 115 includes n-channel FET TN3 and p-channel FET TP5, configured as inverter INV1, and n-channel FET TN1 in a cascode configuration. Noise margin circuit 105 includes p-channel FET TP4 and n-channel FET TN2 configured as a diode.

In discharge circuit 115, FET TNI couples and decouples bitline 110 from sense node 120 in response to the voltage level VB of bitline 110. The gates of n-channel FET TN3 and p-channel FET TP5, configured as inverter INV1, are coupled to each other and bitline 110. The output of inverter INV1 is coupled to the gate of FET TN1, at node 240. FET TN1 acts as a cascode transistor. As the voltage level VB of bitline 110 increases, the voltage VD at node 240 decreases. Conversely, the voltage VD increases as VB decreases. The source of FET TN1 is coupled to bitline 110 such that increasing VB results in the rapid decrease of the gate-source voltage of TN1 towards the threshold voltage Vtn1 of TN1. Similarly, any decrease in VB results in the rapid increase of the gate-source voltage of TN1. When the FET TN1 initially switches off, the gate-source voltage (VD−VB) is approximately equal to the threshold voltage Vtn1 of the FET TN1.

Noise margin circuit 105 includes FETs TN2 and TP4. FET TP4 has its gate coupled to the precharge signal at node 270. Thus, when the precharge signal is low, FET TP4 will be switched on to pull bitline 110 up towards Vcc. The extent to which the bitline voltage VB is increased after discharge circuit 115 decouples bitline 110 from sense node 120 is determined by the operating characteristics of FET TN2. FET TN2 typically remains on for a time after FET TN1 switches off, until VB reaches Vcc−Vtn1, so that bitline 110 is charged higher to provide a noise margin. Thus, the gate-source voltage (VD−VB) of FET TN1 when the noise margin circuit 105 switches off is equal to (Vtn1−Vnoise).

In operation, if the selected memory location is programmed, FET TN1 switches on, coupling bitline 110 to the sense node 120. Sense node 120 and the bitline 110 are discharged towards ground. When the precharge signal at node 270 goes low and the select voltage to the selected wordline is removed, sense node 120 and the bitline 110 begin to be charged towards Vcc. FET TN1 remains on until bitline 110 is charged sufficiently to decrease VD such that the gate-source voltage of the FET TN1 is approximately Vtn1.

Bitline 110 is initially charged both by FET TP4 and precharge circuit 106 via FET TN2 and FET TN1, respectively. When FET TN1 is switched off, decoupling sense node 120 from bitline 110, bitline 110 continues to be charged towards Vcc through FET TN2, which has its drain coupled to Vcc via node 260 and FET TP4. Bitline 110 is charged until the gate-source voltage for FET TN2 drops to the threshold voltage for FET TN2, causing FET TN2 to decouple bitline 110 from node 260. The continued charging of the bitline 110 causes the voltage VD at node 240 to be further decreased such that the gate-source voltage of the FET TN1 is less than Vtn1 by the noise margin voltage Vnoise.

A more detailed discussion of the operation of prior art single ended dynamic sense amplifier 100 is set forth in the above referenced U.S. Pat. No. 5,495,191 entitled "SINGLE ENDED DYNAMIC SENSE AMPLIFIER" incorporated herein, in its entirety, by reference.

Single ended dynamic sense amplifiers such as prior art single ended dynamic sense amplifier 100 provide lower power consumption and increased speed because the bitline does not need to be charged all the way to Vcc. Further, single ended dynamic sense amplifiers improve speed through the use of charge sharing between the input and the bitline, which allows the output circuit to include lower sensitivity devices. Consequently, single ended dynamic sense amplifiers have the potential to be an extremely efficient solution to the problems associated with older prior art sense amplifiers. However, as discussed below, prior art single ended dynamic sense amplifiers do have one serious drawback in that prior art single ended dynamic sense amplifiers are not well suited for low voltage applications.

Referring back to FIG. 2, it can be seen that the voltage, Vp, supplied to node 273, and gate 275 of FET TN3, by Vcc, is approximately equal to Vcc minus the threshold voltage of FET TN2, Vtn2, i.e., $$Vp=Vcc-Vtn2$$

As discussed above, during the precharge state, inverter INV1 must have sufficient drive strength to shut off FET TN1 by pulling node 240 down close to Vss or ground. Typically TN3 needs drive strength at least equal to Vtn3 plus two hundred millivolts to shut off TN1. Typically this means a minimum drive strength of 0.7 volts. However, if Vcc is close to Vtn2, then Vp is close to zero. Since, in low voltage applications, Vcc on bitline 110 is typically at or close to Vtn2, when Vp is close to zero, the necessary drive strength for INV1 is not maintained and TN1 remains on at all times. This causes prior art single ended dynamic sense amplifier 100 to fail to perform its function.

Typically, the threshold voltage for an FET, Vt, is on the order of 0.5 volts. However, Vt is a function of the circuit fabrication process and can vary by as much as 0.2 volts from process to process. In addition, since TN2 is not coupled to Vss, Vtn2 is 0.7 volt rather than the typical 0.5 volt due to the well known body effect. As a result, a minimum Vcc for prior art single ended dynamic sense amplifier 100 must be at least Vtn2 plus Vtn3 plus two hundred millivolts, or 1.4 volts. Consequently, prior art single ended dynamic sense amplifier 100 is not suitable for applications where Vcc less than 1.4 volts and, therefore, prior art single ended dynamic sense amplifiers are typically excluded from low voltage applications. Unfortunately, this is a serious drawback in the present electronics market which emphasizes fast-low voltage-low power memory units. What is needed is a single ended dynamic sense amplifier which has a lower and wider supply voltage operating range and is therefore suitable for lower voltage and higher speed applications.

SUMMARY OF THE INVENTION

According to the principles of the invention, a sense amplifier circuit for sensing the state of a first node, such as a bitline of a memory or a matchline of a comparator, includes an output circuit having an input or "sense" node and an output, the output is for indicating the state of the first node in response to a voltage level at the first node. A precharge circuit is coupled to the input node for charging the input node to a precharge voltage level and a discharge circuit is coupled to the first node and the input node for discharging the input node from the precharge voltage level to the voltage level of the first node. Also included is a threshold control circuit coupled to the first node and having an output coupled to the discharge circuit for providing a discharge input voltage to the discharge circuit. In one embodiment, The discharge circuit couples the input node to the first node when the discharge input voltage from the threshold control circuit reaches a first threshold voltage. In addition, a noise margin circuit is coupled to the first node. The noise margin circuit charges the first node to a second voltage level that is greater than the first threshold voltage by a predetermined noise margin voltage.

In one embodiment of the invention, the discharge circuit includes a first transistor which has a first flow node, a second flow node, and a control node. In this embodiment, the first flow node is coupled to the input or sense node, the second flow node is coupled to the first node, and the control node is coupled to an output of the threshold control circuit to receive the discharge input voltage. In this manner, the first transistor couples the input node to the first node when the discharge input voltage from the output of the threshold control circuit reaches the threshold voltage of the first transistor.

In one embodiment, the noise margin circuit includes a diode, which can be a transistor configured as a diode, coupled between the first node and a first supply voltage, such as Vcc, for clamping the first node voltage to a predetermined level.

In one embodiment, the threshold control circuit includes: a second transistor having a first flow node, a second flow node, and a control node with the second flow node coupled to the first supply voltage, such as Vcc, and the control node coupled to the first node; and a third transistor having a first flow node, a second flow node and a control node with the second flow node coupled to a second supply voltage, such as Vss and the control node coupled to a tap node located between the diode and the first supply voltage. In this embodiment, the first flow node of the second transistor and the first flow node of the third transistor are coupled to each other and the output of the threshold control circuit. The output of the threshold control circuit is then coupled to the control node of the first transistor so that the control node of the first transistor receives the discharge input voltage from the coupled first flow nodes of the second and third transistors.

In another embodiment of the invention, the noise margin circuit includes a second transistor, having a first flow node, a second flow node, and a control node with the first flow node and the control node coupled to the first supply voltage. In this embodiment, the threshold control circuit includes: a third transistor having a first flow node, a second flow node, and a control node, with the second flow node coupled to the first supply voltage and the control node coupled to the first node; a diode, which can be a properly configured transistor, coupled between the second flow node of the second transistor and the first node; and a fourth transistor having a first flow node, a second flow node and a control node, with the second flow node coupled to the second supply voltage and the control node coupled to a tap node located between the diode and the second flow node of the second transistor. In this embodiment, as in the first embodiment, the first flow node of the third transistor and the first flow node of the fourth transistor are coupled to each other and the output of the threshold control circuit. The output of the threshold control circuit is then coupled to the control node of the first transistor such that the control node of the first transistor receives the discharge input voltage from the coupled first flow nodes of the third and fourth transistors.

In one embodiment, the first, second, third, fourth, and fifth transistors discussed above are field effect transistor (FET), the first and second flow nodes of which are drain or source nodes, and the control nodes of which are gate nodes.

As discussed in more detail below, a single ended dynamic sense amplifier designed according to the principles of the invention provides the higher sensitivity and fast switching times of prior art single ended dynamic sense amplifiers even in applications with a low supply voltage. Herein, a "low supply voltage" is defined as a supply voltage close to 1.0 volt and below 1.4 volts. This goal is accomplished, according to the principles of the invention, without resorting to complicated additional circuity. The single ended dynamic sense amplifier of the invention can also be used to implement a wide or "high fan in" dynamic "AND" gate in a comparator, i.e., an AND gate that has a large number of inputs, because the single ended dynamic sense amplifier of the invention overcomes the huge speed penalties incurred in these large complex circuits.

A single ended dynamic sense amplifier designed according to the principles of the invention also reduces overall power consumption while increasing the overall speed. In addition, the single ended dynamic sense amplifier of the invention is "plug compatible", i.e., is a modular replacement for other single ended sense amplifiers. Modularity is achieved by designing a buffering mechanism at the output stage which isolates the cascode sensing portion of the circuit from the load introduced by the attached output circuitry.

Another advantage of the single ended dynamic sense amplifier of the invention is that since the voltage supplied to the gate of the "pull down" FET is larger, the "pull down" FET can be fabricated to operate at a smaller voltage level. Having a smaller transistor reduces the parasitic capacitance at the output and input and thus makes the single ended dynamic sense amplifier more sensitive and increases the sensing speed.

In addition, with the single ended dynamic sense amplifier of the invention, the noise margin, and sensitivity of the sense amplifier can be varied in a controlled, flexible, and quantized manner by simply adding additional diodes, or diode configured transistors. This is in contrast to the prior art single ended dynamic sense amplifiers where the noise margins was varied by varying the dimensions of the components such as the channel widths or transistor size.

DETAILED DESCRIPTION

In the discussion below, well known circuits are shown in block diagram form in order not to obscure the invention unnecessarily. In addition, several circuits whose structure and operation are discussed at length in the above referenced, and incorporated, U.S. Pat. No. 5,495,191 entitled "SINGLE ENDED DYNAMIC SENSE AMPLIFIER" are also shown in block diagram form to likewise avoid unnecessarily obscuring the invention.

Figure 1:
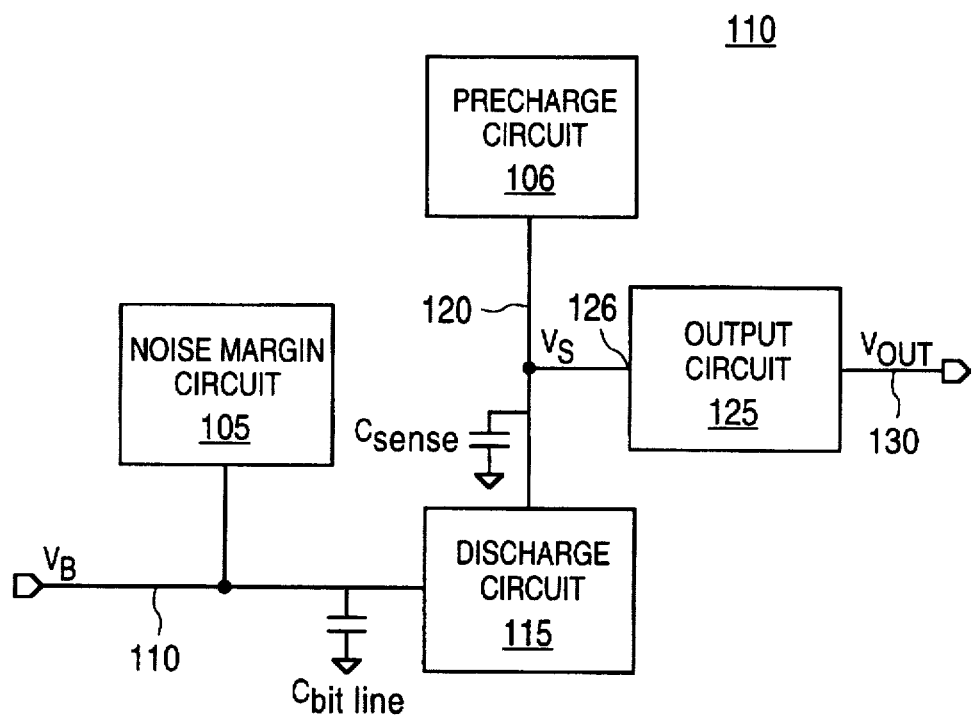
FIG. 1 is a block diagram of a prior art single ended dynamic sense amplifier.
Figure 3:
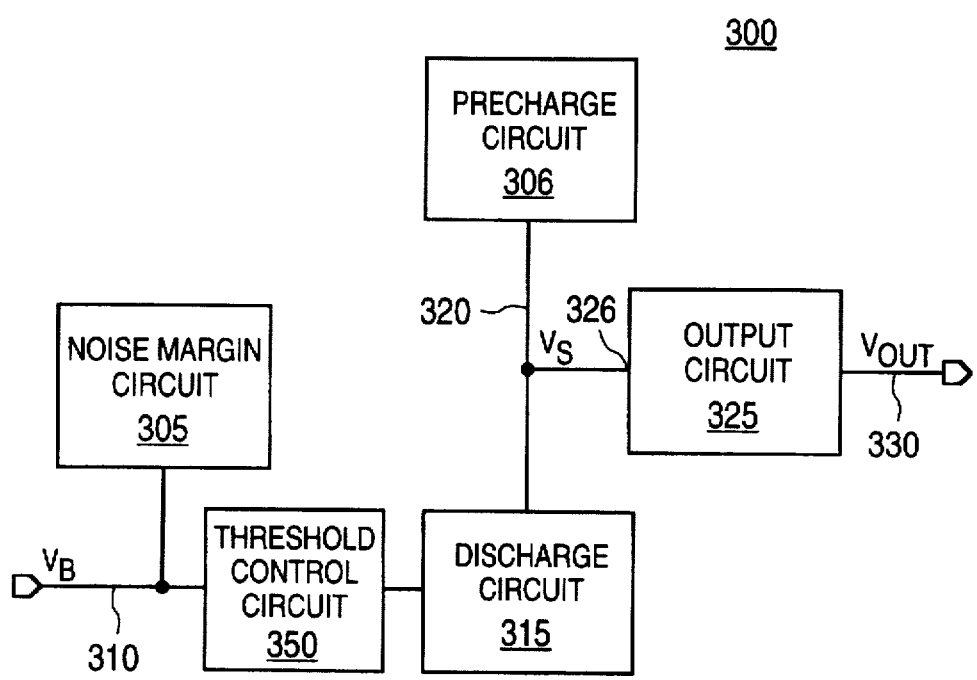
FIG. 3 is a block diagram of one embodiment of a single ended dynamic sense amplifier incorporating the principles of the invention.

FIG. 3 is a block diagram of one embodiment of a single ended dynamic sense amplifier 300, incorporating the principles of the invention, which includes: an output circuit 325, having an input 326 and an output 330 for indicating the state of bitline 310, in response to a bitline voltage level (VB), and a precharge circuit 306 which precharges sense node 320 and input 326 between read cycles to a sense voltage (Vs) which is typically approximately Vcc. The structure and operation of output circuit 325 and precharge circuit 306 is substantially identical to the structure and operation of output circuit 125 and precharge circuit 106 shown in FIG. 1, as discussed above. Consequently, the structure and operation of output circuit 325 and precharge circuit 306 will not be discussed further in order not to obscure the invention unnecessarily.

Single ended dynamic sense amplifier 300 also includes a threshold control circuit 350 coupled to a noise margin circuit 305 and a discharge circuit 315. Sense node 320 couples discharge circuit 315 to precharge circuit 306 and input 326 of output circuit 325. As discussed in more detail below, threshold control circuit 350 maintains a bias on discharge circuit 315 such that during the precharge phase of operation, discharge circuit 315 is shut off and then conditionally turned off and on even if Vcc is close to 1.0 volt.

Figure 4:
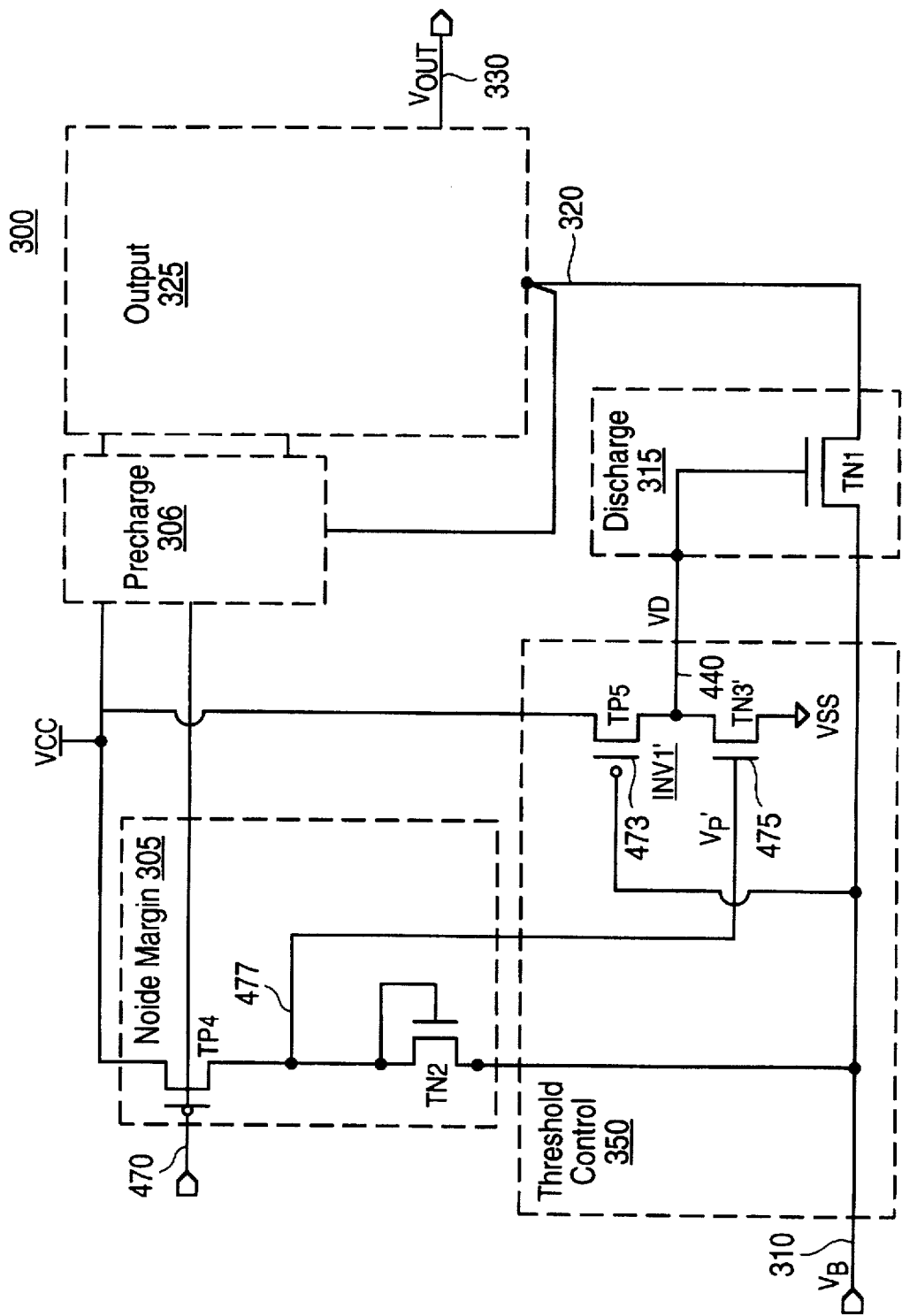
FIG. 4 is one embodiment of single ended dynamic sense amplifier according to the principles of the invention which shows the noise margin circuit and the discharge circuit in more detail.

FIG. 4 shows one embodiment of single ended dynamic sense amplifier 300 with noise margin circuit 305, threshold control circuit 350, and discharge circuit 315 illustrated in more detail. As shown in FIG. 4, discharge circuit 315 includes n-channel FET TN1 configured as a cascode device. Noise margin circuit 305 includes p-channel FET TP4 and n-channel FET TN2 configured as a diode. Threshold control circuit 350 includes n-channel "pull down" FET TN3' and p-channel FET TP5, configured as a modified dual input inverter INV1'.

Figure 2:
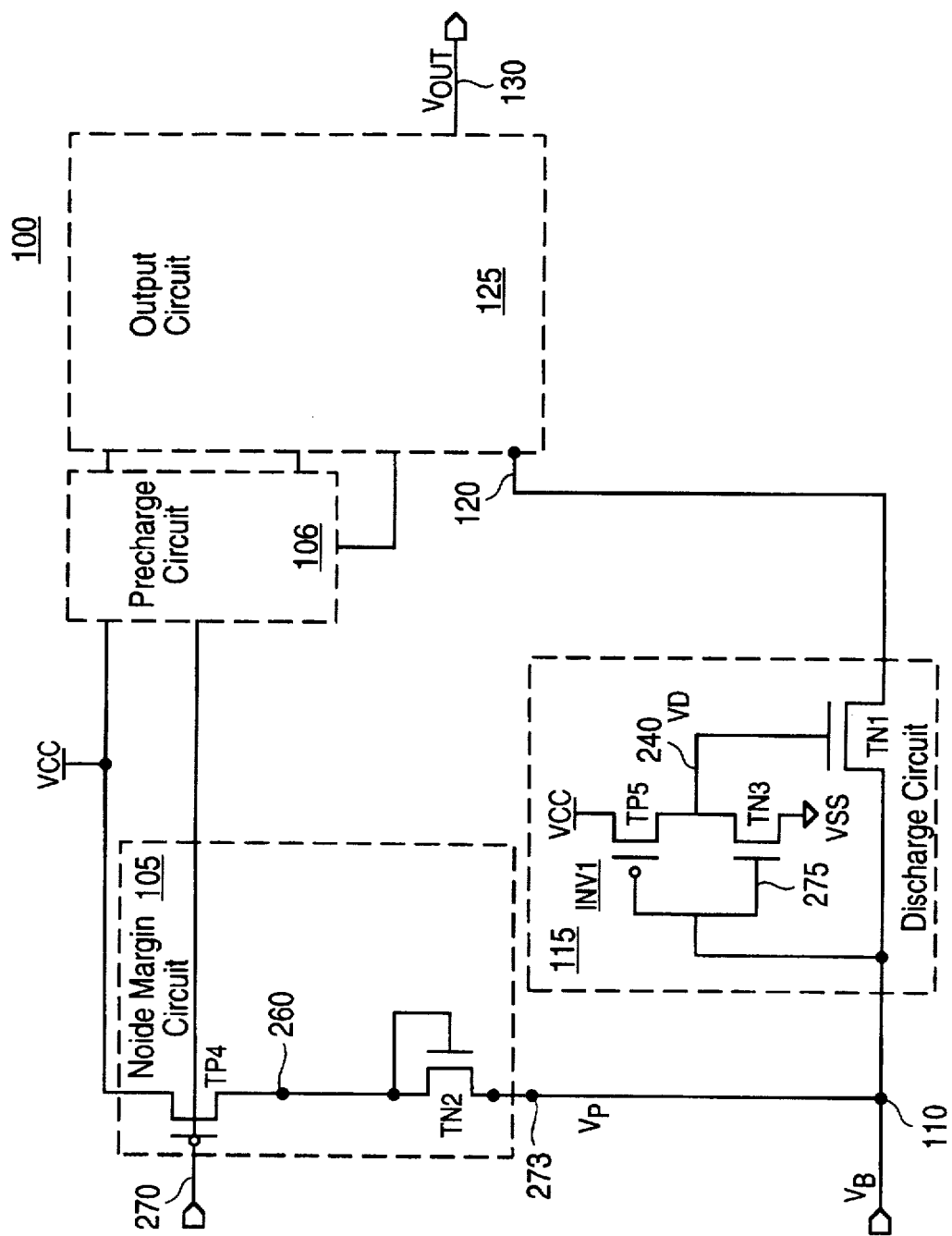
FIG. 2 is a prior art single ended dynamic sense amplifier with the noise margin circuit and the discharge circuit shown in more detail.

As can be seen in FIG. 4, inverter INV1' is a modified dual input inverter with one input being supplied by bitline 310 to the gate 473 of p-channel FET TP5 and the other input being supplied from tap node 477 to the gate 475 of n-channel FET TN3'. The advantage of this configuration is that the voltage, Vp', supplied at gate 475 of FET TN3', is kept at approximately Vcc, i.e., Vp' is not affected by the threshold voltage of TN2. Consequently, voltage Vp' at gate 475 is larger than the voltage Vp at gate 275 of TN3 (see FIG. 2) by Vtn2. In addition, n-channel FET TN2, configured as a diode, ensures that tap node 477 tracks VB closely, thereby allowing TP5 and TN3' to perform like a normal inverter.

As a result of the dual input configuration, modified inverter INV1' has sufficient drive strength to shut off FET TN1, by pulling node 440 down close to Vss or ground, even when Vcc is below 1.4 volts. Consequently, threshold control circuit 350, including modified inverter INV1', allows TN1 to turn off and on conditionally, and single ended dynamic sense amplifier 300 to function properly, even in low voltage applications where Vcc is close to 1.0 volt.

Another advantage of single ended dynamic sense amplifier 300 is that since the voltage supplied to gate 475 of FET TN3', the "pull down" transistor, located in inverter INV 1', is larger, FET TN3' can be fabricated as a smaller transistor. Having a smaller TN3' reduces the parasitic capacitance at output 440 and inputs 473 and 475. Consequently, single ended dynamic sense amplifier 300 is more sensitive and has increased sensing speed.

Single ended dynamic sense amplifier 300 represents a marked improvement over prior art single ended dynamic sense amplifiers, such as prior art single ended dynamic sense amplifier 100, which, as discussed above, are not suited for applications where Vcc is less than 1.4 volts. Consequently, using the principles of the invention, low voltage devices such as laptops and notebooks can now be designed using single ended dynamic sense amplifiers with all their advantages in terms of speed and power consumption.

Other modifications can be made to a single ended dynamic sense amplifier designed according to the principles of the invention which increase speed, increase sensitivity, decrease power consumption, and further lower the Vcc operating voltages of the circuit. For example, FIG. 5 shows a second embodiment of single ended dynamic sense amplifier 500 designed according to the principles of the invention.

Figure 5:
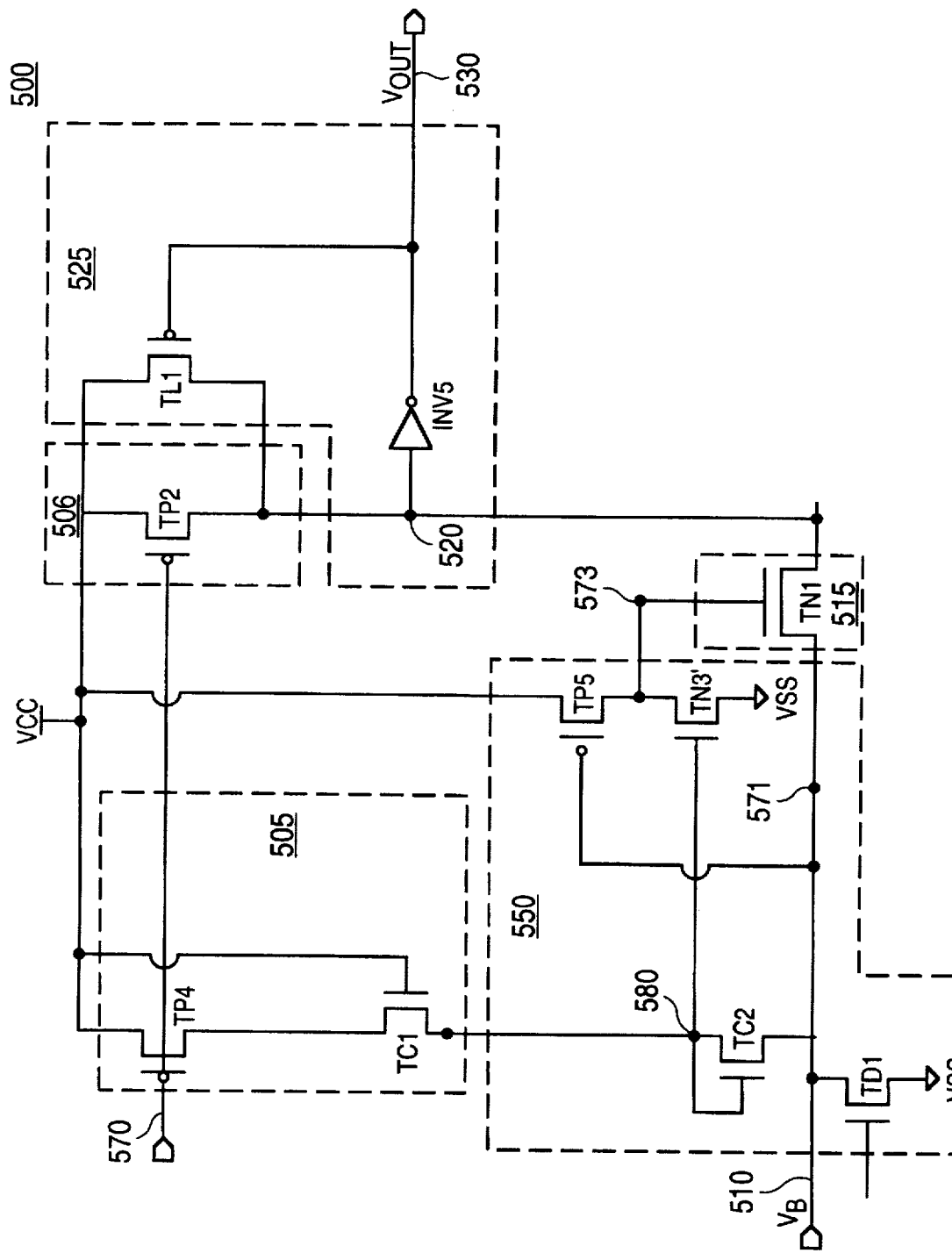
FIG. 5 is a second embodiment of a single ended dynamic sense amplifier designed according to the principles of the invention.

As shown in FIG. 5, single ended dynamic sense amplifier 500 includes a noise margin circuit 505 comprising p-channel FET TP4, for precharging bitline 510 and first node 571, and a first n-channel FET clamping device TC1. Single ended dynamic sense amplifier 500 also includes a precharge circuit 506 comprising p-channel FET TP2, for precharging sense or input node 520. In this embodiment, an output circuit 525 comprises p-channel FET TL1, which is a half-latch for retaining the "match" state of single ended dynamic sense amplifier 500 after TP2 is turned off, and inverter INV5 which is an output buffer. Single ended dynamic sense amplifier 500 further includes a discharge circuit 515 comprising n-channel cascode FET TN1, for isolating nodes 571 and 520 during precharge and sharing the charge of nodes 571 and 520 when bitline 510 reaches a predetermined threshold voltage, and a threshold control circuit 550 which, in this embodiment, includes: a second n-channel FET clamping device TC2, configured as a diode for precharge level control; threshold control n-channel FET TN3', for shutting off TN1; and threshold control p-channel FET TP5, for turning on TN1. In this embodiment of the invention, all of the above elements are connected as shown in FIG. 5. The interaction and operation of these elements is discussed in more detail below.

The operation of a single ended dynamic sense amplifier designed according to the principles of the invention will now be discussed with reference to the specific embodiment shown in FIG. 5. However, those of skill in the art will recognize that other embodiments of a single ended dynamic sense amplifier can be designed which incorporate the principles of the invention. Therefore, the following discussion is not to be construed as limiting the invention to the specific embodiment discussed.

Returning to FIG. 5, single ended dynamic sense amplifier 500 operates in two phases: the precharge phase and the evaluation phase. In the precharge phase, the precharge or clock signal at input 570 is a logic low, or zero, and TP4 is on to precharge node 571. TC1 and TC2 are in the precharge path so that node 571 is charged to a voltage V571 equal to Vcc minus the threshold voltage of TC1 and the threshold voltage of TC2, i.e., V571=Vcc−Vtc1−Vtc2. TC1 and TC2 thus clamp the precharge level of node 571 and thereby reduce the voltage swing on node 571. This results in a reduced consumption of power and increased speed of operation for single ended dynamic sense amplifier 500.

Also during this precharge phase, TP2 is on, precharging node 520 to Vcc, and TN1 is off, thereby isolating node 571 from node 520. At this time, the gate-source voltage of TN3', Vgs3, is equal to Vcc minus the threshold voltage of TC1, i.e., Vgs3=Vcc−Vtc1. The bitline precharge voltage is equal to Vcc minus the threshold voltage of TC1 and the threshold voltage of TC2, i.e., VB =Vcc−Vtc1−Vtc2. In one embodiment, TN3' and TP5 are sized so that when node 571 is at VB, the high state, threshold output node 573 is at a voltage less than VB. Consequently, the gate-source voltage for TN1 is below zero, and TN1 is shut off. Since node 520 is precharged to Vcc by TP2, the output signal of single ended dynamic sense amplifier 500, at output 530, is low, or zero.

In the embodiment of the invention shown in FIG. 5, the gate of TN3' is tied to tap node 580 so that the voltage on the gate of TN3' is at a voltage higher than node 571 by the threshold voltage of TC2, i.e., Vgt3=V571+Vtc2. This configuration has two advantages. First, TN3' can be a smaller device yet still drive TN1 off. Second, at very low Vcc levels, such as 1.1 volts, TN3' is not off at all times, it would be if the gate of TN3' were tied to VB as is done in the prior art. Thus, the invention saves power and ensures that single ended dynamic sense amplifier 500 is functional at Vcc voltages of close to 1.0 volt.

When single ended dynamic sense amplifier 500 is operating in the evaluation phase, i.e., when the precharge or clock signal at input 570 is a logic high, or one, TP4 turns off and the voltage on bitline 510, VB, is maintained at Vcc minus the threshold voltage of TC1 and TC2, i.e., VB=Vcc−Vtc1−Vtc2. In one embodiment of the invention, a leaker circuit, (not shown) is used to maintain VB at the desired voltage. Typically, a leaker circuit has a structure similar to TP4, TC1, and TC2 in FIG. 5 but with smaller components. Leaker circuits and other similar devices are well known to those of skill in the art.

Also in the evaluation phase, TP2 is off and node 520 is high. Consequently, the output signal of single ended dynamic sense amplifier 500, at output node 530, remains low until one or more (only one is shown in FIG. 5) bitline drivers TD1 turn on. TD1 turns on conditionally depending on the stored data. When TD1 turns on, bitline 510 is discharged by TD1 and the voltage of node 571 drops, cutting off TN3'. TP5 then pulls threshold control circuit output node 573 up until the gate-source voltage of TN1 is greater than the threshold voltage of TN1. This causes TN1 to turn on and share the charge between node 571 and node 520. Since node 571 is at a much lower voltage, and is more capacitive, than node 520, the voltage at node 520 drops very rapidly to almost zero. Consequently, the output signal at output node 530 goes to a logic high, or one.

As discussed above, a single ended dynamic sense amplifier designed according to the principles of the invention provides the higher sensitivity and fast switching times of prior art single ended dynamic sense amplifiers, even in applications with low supply voltages. This goal is accomplished without resorting to complicated additional circuitry.

Those of ordinary skill in the art will recognize that the single ended dynamic sense amplifier of the invention can also be used to implement a wide dynamic or "high fan in" AND gate in a comparator, i.e., an "AND" gate that has a large number of inputs because the single ended dynamic sense amplifier of the invention overcomes the huge speed penalties incurred in these large complex logic gates.

A single ended dynamic sense amplifier designed according to the principles of the invention also reduces overall power consumption while increasing the overall speed. In addition, the single ended dynamic sense amplifier of the invention is "plug compatible", i.e., is a modular replacement for other single ended sense amplifiers. Modularity is achieved by designing a buffering mechanism at the output stage which isolates the cascode sensing portion of the circuit from the load introduced by the attached output circuitry.

Another advantage of the single ended dynamic sense amplifier of the invention is that since the voltage supplied to its gate is larger by the factor of a threshold voltage, the "pull down" FET (TN3' in FIG. 5) can be fabricated as a smaller transistor. Having a smaller transistor reduces the parasitic capacitance. Consequently, the single ended dynamic sense amplifier of the invention is more sensitive and has increased sensing speed.

In addition, with the single ended dynamic sense amplifier of the invention, the noise margin, and sensitivity of the sense amplifier can be varied in a controlled, flexible, and quantized manner by simply adding additional diode configured transistors (such as transistor TC2 in FIG. 5). This is in contrast to the prior art single ended dynamic sense amplifiers where the noise margins are varied by varying the dimensions of the components such as the channel widths or transistor size.

Although the present invention is described with reference to specific circuits, block diagrams, signals, algorithms, etc., it will be appreciated by one of ordinary skill in the art that such details are disclosed simply to provide a more thorough understanding of the present invention. It will therefore be apparent to one skilled in the art that the present invention may be practiced without the specific details.

What is claimed is:

1. A sense amplifier circuit for sensing a state of a first node, the sense amplifier circuit comprising:
   an output circuit having an input node and an output, the output for indicating a state of the first node in response to a voltage level at the first node;
   a precharge circuit coupled to the input node, the precharge circuit for charging the input node to a precharge voltage level;
   a discharge circuit coupled to the first node and the input node, the discharge circuit for discharging the input node from the precharge voltage level to the voltage level of the first node, the discharge circuit comprising:
   a first field effect transistor (FET) having a drain, a source, and a gate, wherein the drain is coupled to the input node and the source is coupled to the first node;
   a noise margin circuit coupled to the first node, the noise margin circuit for charging the first node to a second voltage level that is greater than a first threshold voltage level of the first FET by a predetermined noise margin voltage, the noise margin circuit comprising:
   a second FET, configured as a diode, coupled between the first node and a first supply voltage for clamping the first node voltage level to the second voltage level;

a threshold control circuit, the threshold control circuit comprising:

a third FET having a drain, a source, and a gate wherein, the source is coupled to the first supply voltage and the gate is coupled to the first node;

a fourth FET having a drain, a source, and a gate, wherein the source is coupled to a second supply voltage and the gate is coupled to a node located between the second FET and the first supply voltage, wherein the drain of the third FET and the drain of the fourth FET are coupled to each other, the output of the threshold control circuit, and to the gate of the first FET such that the gate of the first FET receives a discharge input voltage from the coupled drains of the third and fourth FETs so that the first FET couples the input node to the first node when the discharge input voltage reaches the first threshold voltage of the first FET.

2. A sense amplifier circuit for sensing a state of a first node, the sense amplifier circuit comprising:

an output circuit having an input node and an output, the output for indicating a state of the first node in response to a voltage level at the first node;

a precharge circuit coupled to the input node, the precharge circuit for charging the input node to a precharge voltage level;

a discharge circuit coupled to the first node and the input node, the discharge circuit for discharging the input node from the precharge voltage level to the voltage level of the first node, the discharge circuit comprising:

a first field effect transistor (FET) having a drain, a source, and a gate, wherein the drain is coupled to the input node and the source is coupled to the first node;

a noise margin circuit coupled to the first node, the noise margin circuit comprising:

a second FET having a drain, a source, and a gate wherein, the drain and the gate are coupled to a first supply voltage;

a threshold control circuit, the threshold control circuit comprising:

a third FET having a drain, a source, and a gate wherein, the source is coupled to the first supply voltage and the gate is coupled to the first node;

a fifth FET, configured as a diode, coupled between the source of the second FET and the first node for clamping the first node voltage to a second voltage level;

a fourth FET having a drain, a source, and a gate, wherein the source is coupled to a second supply voltage and the gate is coupled to a tap node located between the fifth FET and the source of the second FET, wherein the drain of the third FET and the drain of the fourth FET are coupled to each other, the output of the threshold control circuit, and to the gate of the first FET such that the gate of the first FET receives a discharge input voltage from the coupled drains of the third and fourth FETs such that the first FET couples the input node to the first node when the discharge input voltage reaches first threshold voltage of the first FET.

3. A sense amplifier circuit for sensing a state of a first node, the sense amplifier circuit comprising:

an output circuit having an input node and an output, the output for indicating a state of the first node in response to a voltage level at the first node;

a precharge circuit coupled to the input node, the precharge circuit for charging the input node to a precharge voltage level;

a discharge circuit coupled to the first node and the input node, the discharge circuit for discharging the input node from the precharge voltage level to the voltage level of the first node;

a threshold control circuit coupled to the first node, wherein the threshold control circuit comprises:

a first transistor having a first flow node, a second flow node, and a control node wherein, the second flow node is coupled to a first supply voltage and the control node is coupled to the first node;

a second transistor having a first flow node, a second flow node and a control node, wherein the second flow node is coupled to a second supply voltage and the control node is coupled to a tap node located between a noise margin circuit and the first supply voltage, wherein the first flow node of the first transistor and the first flow node of the second transistor are coupled to each other and an input of the discharge circuit such that the input of the discharge circuit receives the discharge input voltage from the coupled first flow nodes of the first and second transistors and the discharge circuit couples the input node to the first node when the discharge input voltage from the threshold control circuit exceeds a first threshold voltage; and the noise margin circuit is coupled to the first node, the noise margin circuit for charging the first node to a second voltage level that is greater than the first threshold voltage by a predetermined noise margin voltage.

4. The sense amplifier circuit of claim 3, wherein the discharge circuit comprises:

a third transistor having a first flow node, a second flow node, and a control node, wherein the first flow node is coupled to the input node, the second flow node is coupled to the first node, and the control node is coupled to an output of the threshold control circuit to receive the discharge input voltage, the third transistor for coupling the input node to the first node when the discharge input voltage from the output of the threshold control circuit reaches the first threshold voltage of the third transistor.

5. The sense amplifier circuit of claim 4, wherein the noise margin circuit comprises:

a diode coupled between the first node and a first supply voltage for clamping the first node voltage to a predetermined level.

6. The sense amplifier circuit of claim 5, wherein the second and third transistors are n-channel field effect transistors (FET's).

7. The sense amplifier circuit of claim 6, wherein the first node is a matchline of a comparator.

8. The sense amplifier circuit of claim 6, wherein the noise margin circuit comprises:

a fourth transistor, having a first flow node, a second flow node, and a control node wherein, the first flow node and the control node are coupled to a first supply voltage.

9. A sense amplifier circuit for sensing a state of a first node, the sense amplifier circuit comprising:

an output circuit having an input node and an output, the output for indicating a state of the first node in response to a voltage level at the first node;

a precharge circuit coupled to the input node, the precharge circuit for charging the input node to a precharge voltage level;

a discharge circuit coupled to the first node and the input node, the discharge circuit for discharging the input node from the precharge voltage level to the voltage level of the first node;

a threshold control circuit coupled to the first node, wherein the threshold control circuit comprises:

a first transistor having a first flow node, a second flow node, and a control node wherein, the second flow node is coupled to the first supply voltage and the control node is coupled to the first node;

a diode, coupled between the second flow node of a second transistor and the first node, the diode for, in combination with the second transistor, clamping the first node voltage to a predetermined level;

a third transistor having a first flow node, a second flow node and a control node, wherein the second flow node is coupled to a second supply voltage, the control node is coupled to a tap node located between the diode and the second flow node of the second transistor, wherein the first flow node of the first transistor and the first flow node of the third transistor are coupled to each other, the output of the threshold control circuit, and an input of the discharge circuit such that the input of the discharge circuit receives the discharge input voltage from the coupled first flow nodes of the first and third transistors and the discharge circuit couples the input node to the first node when the discharge input voltage from the threshold control circuit exceeds a first threshold voltage.

10. The sense amplifier circuit of claim 9, wherein the second and third transistors are n-channel field effect transistors (FETs).

11. The sense amplifier circuit of claim 10, wherein the first node is a matchline of a comparator.

12. A computer system comprising:

a memory; and a processor coupled to the memory, the processor including a register file having a memory location and a sense amplifier circuit coupled to the memory location via a first node, the sense amplifier circuit for determining a state of the memory location, the sense amplifier circuit including:

output circuit having an input node and an output, the output for indicating a state of the first node in response to a voltage level at the first node;

a precharge circuit coupled to the input node, the precharge circuit for charging the input node to a precharge voltage level;

a discharge circuit coupled to the first node and the input node, the discharge circuit for discharging the input node from the precharge voltage level to the voltage level of the first node;

a threshold control circuit coupled to the first node, wherein the threshold control circuit comprises:

a first transistor having a first flow node, a second flow node, and a control node wherein, the second flow node is coupled to a first supply voltage and the control node is coupled to the first node;

a second transistor having a first flow node, a second flow node and a control node, wherein the second flow node is coupled to a second supply voltage and the control node is coupled to a tap node located between a noise margin circuit and the first supply voltage, wherein the first flow node of the first transistor and the first flow node of the second transistor are coupled to each other and an input of the discharge circuit such that the input of the discharge circuit receives the discharge input voltage from the coupled first flow nodes of the first and second transistors and the discharge circuit couples the input node to the first node when the discharge input voltage from the threshold control circuit exceeds a first threshold voltage; and the noise margin circuit is coupled to the first node, the noise margin circuit for charging the first node to a second voltage level that is greater than the first threshold voltage by a predetermined noise margin voltage.

13. The computer system of claim 12, wherein the discharge circuit comprises: a third transistor having a first flow node, a second flow node, and a control node, wherein the first flow node is coupled to the input node, the second flow node is coupled to the first node, and the control node is coupled to an output of the threshold control circuit to receive the discharge input voltage, the third transistor for coupling the input node to the first node when the discharge input voltage from the output of the threshold control circuit reaches the first threshold voltage of the third transistor.

14. The computer system of claim 13, wherein the noise margin circuit comprises:

a diode coupled between the first node and a first supply voltage for clamping the first node voltage to a predetermined level.

15. The computer system of claim 14, wherein the second and third transistors are n-channel field effect transistors (FET's).

16. The sense amplifier circuit of claim 15, wherein the first node is a matchline of a comparator.

17. The computer system of claim 12, wherein the noise margin circuit comprises:

a fourth transistor, having a first flow node, a second flow node, and a control node wherein, the first flow node and the control node are coupled to a first supply voltage.

18. A computer system comprising:

a memory; and a processor coupled to the memoroy, the processor including a register file having a memory location and a sense amplifier circuit coupled to the memory location via a first node, the sense amplifier circuit for determining a state of the memory location, the sense amplifier circuit including:

an output circuit having an input node and an output, the output for indicating a state of the first node in response to a voltage level at the first node;

a precharge circuit coupled to the input node, the precharge circuit for charging the input node to a precharge voltage level;

a discharge circuit coupled to the first node and the input node, the discharge circuit for discharging the input node from the precharge voltage level to the voltage level of the first node;

a threshold control circuit coupled to the first node, wherein the threshold control circuit comprises:

a first transistor having a first flow node, a second flow node, and a control node wherein, the second flow node is coupled to the first supply voltage and the control node is coupled to the first node;

a diode, coupled between the second flow node of a second transistor and the first node, the diode for, in combination with the second transistor, clamping the first node voltage to a predetermined level;

a third transistor having a first flow node, a second flow node and a control node, wherein the second flow node is coupled to a second supply voltage, the control node is coupled to a tap node located between the diode and the second flow node of the second transistor, wherein the first flow node of the first transistor and the first flow node of the third transistor are coupled to each other, the output of the threshold control circuit, and an input of the discharge circuit such that the input of the discharge circuit receives the discharge input voltage from the coupled first flow nodes of the first and third transistors and the discharge circuit couples the input node to the first node when the discharge input voltage from the threshold control circuit exceeds a first threshold voltage.

19. The computer system of claim 18, wherein the second and third transistors are n-channel field effect transistors (FETs).

\* \* \* \* \*